(12) United States Patent
Zanati et al.

(10) Patent No.: US 12,451,578 B2
(45) Date of Patent: Oct. 21, 2025

(54) INTERPOSERS WITH MILLIMETER-WAVE COAXIAL-TO-WAVEGUIDE TRANSISTIONS

(71) Applicant: NXP B.V., Eindhoven (NL)

(72) Inventors: Abdellatif Zanati, Hamburg (DE);
Jonas Ove Harm, Hamburg (DE);
Adrianus Buijsman, Nijmegen (NL)

(73) Assignee: NXP B.V., Eindhoven (NL)

( * ) Notice: Subject to any disclaimer, the term of this patent is extended or adjusted under 35 U.S.C. 154(b) by 350 days.

(21) Appl. No.: 18/149,015

(22) Filed: Dec. 30, 2022

(65) Prior Publication Data

US 2024/0224423 A1 Jul. 4, 2024

(51) Int. Cl.
| | |
|---|---|
| *H01P 5/103* | (2006.01) |
| *H01P 5/08* | (2006.01) |
| *H01Q 1/22* | (2006.01) |
| *H05K 1/11* | (2006.01) |
| *H01P 3/12* | (2006.01) |

(52) U.S. Cl.
CPC ............. *H01P 5/103* (2013.01); *H01P 5/085* (2013.01); *H01Q 1/22* (2013.01); *H05K 1/111* (2013.01); *H05K 1/115* (2013.01); *H01P 3/121* (2013.01)

(58) Field of Classification Search
CPC ................................ H01P 5/103; H01P 3/121
USPC .......................................................... 333/26
See application file for complete search history.

(56) References Cited

U.S. PATENT DOCUMENTS

| | | | |
|---|---|---|---|
| 9,196,951 B2 | 11/2015 | Baks et al. | |
| 2011/0084398 A1* | 4/2011 | Pilard et al. | ............ H01P 5/107 |
| | | | 257/774 |
| 2011/0267152 A1 | 11/2011 | Lee | |
| 2015/0048471 A1* | 2/2015 | Hasch et al. | ............ H01P 5/107 |
| | | | 257/664 |
| 2015/0295295 A1* | 10/2015 | Uemichi | ................. H01P 3/003 |
| | | | 333/26 |
| 2015/0364804 A1 | 12/2015 | Tong et al. | |

(Continued)

FOREIGN PATENT DOCUMENTS

| | | |
|---|---|---|
| EP | 3647807 A1 | 5/2020 |
| WO | WO-2020231905 A1 | 11/2020 |
| WO | WO-2021016217 A1 | 1/2021 |

OTHER PUBLICATIONS

Kai, Takafumi et al; "Coaxial-Line Feed for Post-Wall Waveguide in Millimeter Wave Band"; Antennas and Propagation Society Symposium vol. IA—Jul. 3, 2005—Washington, DC, USA; 4pages; (Jul. 3, 2005).

*Primary Examiner* — Benny T Lee

(57) ABSTRACT

A circuit-board interposer includes contacts on a top surface and a bottom surface and includes a millimeter-wave coaxial transition structure formed using contacts on the top surface and vias extending into the interposer. A first via extends into the interposer to a first depth and is surrounded by additional vias that penetrate the interposer to a second depth smaller than the first depth. The interposer also includes a hollow conductive waveguide structure formed within the interposer that extends from the second depth to a third depth that has a first end and a second end. The first via extends into the waveguide at the first end and an aperture is present at the second end. The coaxial transition and the waveguide together are configured to couple millimeter-wave energy from a feed contact on the top surface of the interposer and direct it to the aperture.

19 Claims, 6 Drawing Sheets

(56) References Cited

U.S. PATENT DOCUMENTS

| | | |
|---|---|---|
| 2017/0125871 A1 | 5/2017 | Ishibashi |
| 2017/0271761 A1 | 9/2017 | Purden et al. |
| 2018/0108968 A1 | 4/2018 | Purden et al. |
| 2018/0108971 A1* | 4/2018 | Connor et al. .......... H01P 5/103 |
| 2020/0287290 A1 | 9/2020 | Yao et al. |
| 2021/0036393 A1 | 2/2021 | Mangaiahgari |
| 2021/0382135 A1 | 12/2021 | Hess et al. |
| 2022/0077566 A1 | 3/2022 | Jo et al. |
| 2022/0231423 A1 | 7/2022 | Park et al. |

* cited by examiner

INTERPOSERS WITH MILLIMETER-WAVE COAXIAL-TO-WAVEGUIDE TRANSISTIONS

FIELD OF THE INVENTION

Embodiments of the subject matter described herein relate to structures and devices for coupling millimeter-wave signals generated by electronic device to external antenna structures.

BACKGROUND OF THE INVENTION

Miniaturized integrated circuits for millimeter-wave communications and other applications often must be coupled to antenna structures to function as intended. In some applications, a launcher configured to couple millimeter-wave radiation is integrated in a device package along with one or more millimeter-wave integrated circuits. In other applications, millimeter-wave integrated circuits are coupled to printed circuit boards that are provided with integrated millimeter-wave launchers that are designed to couple to millimeter-wave antenna structures.

SUMMARY OF THE INVENTION

In an example embodiment, a device includes an interposer circuit board ("interposer") having a top surface and a bottom surface; a first set of electrical contacts disposed on the top surface of the interposer; a second set of electrical contacts disposed on the bottom surface of the interposer; a coaxial transition structure; and a waveguide structure.

The coaxial transition structure formed by a first via and a set of additional vias. The first via that extends along a vertical direction from a feed contact belonging to the first set of electrical contacts to a first depth within the substrate; and the set of additional vias surround the first via and extend along the vertical direction from the top surface of the substrate to second depth within the substrate that is less than first depth. Each of the vias of the set of additional vias are electrically short-circuited to each other and are separated from the first via by dielectric material of the interposer.

The waveguide structure is formed within the interposer beneath the set of additional vias that defines a volume in which wireless signals coupled to the waveguide propagate; and the waveguide structure extends in a horizontal direction from a first waveguide end to a second waveguide end. The waveguide structure extends along a vertical direction from the second depth within the interposer to a third depth within the interposer that is greater than the second depth. The waveguide structure has an aperture at the third depth within the interposer at the second waveguide end where conductive material defining the waveguide is absent.

The first via penetrates the waveguide structure at the first waveguide end and extends within the waveguide structure from the first depth to the second depth. The coaxial transition structure and the waveguide structure are jointly configured and arranged to direct millimeter-wave energy delivered to the feed contact to the aperture in the waveguide structure.

In another example embodiment, a system includes an interposer having a top surface and a bottom surface; an integrated circuit bonded to the top surface of the interposer; and an additional circuit board having a top surface bonded to the bottom surface of the interposer.

The interposer also includes first set of electrical contacts disposed on the top surface of the interposer; a second set of electrical contacts disposed on the bottom surface of the interposer; a coaxial transition structure; and a waveguide structure.

The coaxial transition structure formed by a first via and a set of additional vias. The first via that extends along a vertical direction from a feed contact belonging to the first set of electrical contacts to a first depth within the substrate; and the set of additional vias surround the first via and extend along the vertical direction from the top surface of the substrate to second depth within the substrate that is less than first depth. Each of the vias of the set of additional vias are electrically short-circuited to each other and are separated from the first via by dielectric material of the interposer.

The waveguide structure is formed within the interposer beneath the set of additional vias that defines a volume in which wireless signals coupled to the waveguide propagate; and the waveguide structure extends in a horizontal direction from a first waveguide end to a second waveguide end. The waveguide structure extends along a vertical direction from the second depth within the interposer to a third depth within the interposer that is greater than the second depth. The waveguide structure has an aperture at the third depth within the interposer at the second waveguide end where conductive material defining the waveguide is absent.

The first via penetrates the waveguide structure at the first waveguide end and extends within the waveguide structure from the first depth to the second depth. The coaxial transition structure and the waveguide structure are jointly configured and arranged to direct millimeter-wave energy delivered to the feed contact to the aperture in the waveguide structure.

The IC, is configured to transmit or receive millimeter-wave signals via the feed contact, is bonded to the top surface of the interposer and electrically coupled to electrical contacts belonging to the first set of electrical contacts. The IC, the interposer, and the additional circuit board are jointly configured and arranged such that wireless millimeter wave signals are coupled between the IC and the additional circuit board via the aperture in the waveguide structure of the interposer.

In another example embodiment, a method includes bonding an interposer having a top surface and a bottom surface to an additional circuit board having an antenna structure. The additional circuit board has a top surface configured to be bonded to the bottom surface of the interposer.

The interposer includes: a first set of electrical contacts disposed on the top surface of the interposer; a second set of electrical contacts disposed on the bottom surface of the interposer; a coaxial transition structure; and a waveguide structure.

The coaxial transition structure is formed by a first via and a set of additional vias. The first via extends along a vertical direction from a feed contact belonging to the first set of electrical contacts to a first depth within the substrate; and the set of additional vias surround the first via and extend along the vertical direction from the top surface of the substrate to second depth within the substrate that is less than first depth. The vias of set of additional vias are electrically short-circuited to each other and are separated from the first via by dielectric material of the interposer.

The waveguide structure is formed within the interposer beneath the set of additional vias and defines a volume in which wireless signals coupled to the waveguide propagate. The waveguide structure extends in a horizontal direction from a first waveguide end to a second waveguide end; and the waveguide structure extends along a vertical direction from the second depth within the interposer to a third depth within the interposer that is greater than the second depth. The waveguide structure has an aperture at the third depth within the interposer at the second waveguide end where conductive material defining the waveguide is absent.

The first via penetrates the waveguide structure at the first waveguide end and extends within the waveguide structure from the first depth to the second depth. The coaxial transition structure and the waveguide structure are jointly configured and arranged to direct millimeter-wave energy delivered to the feed contact to the aperture in the waveguide structure. The interposer, and the additional circuit board are jointly configured and arranged such that wireless millimeter wave signals are coupled between the feed contact and the additional circuit board via the aperture in the waveguide structure of the interposer.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
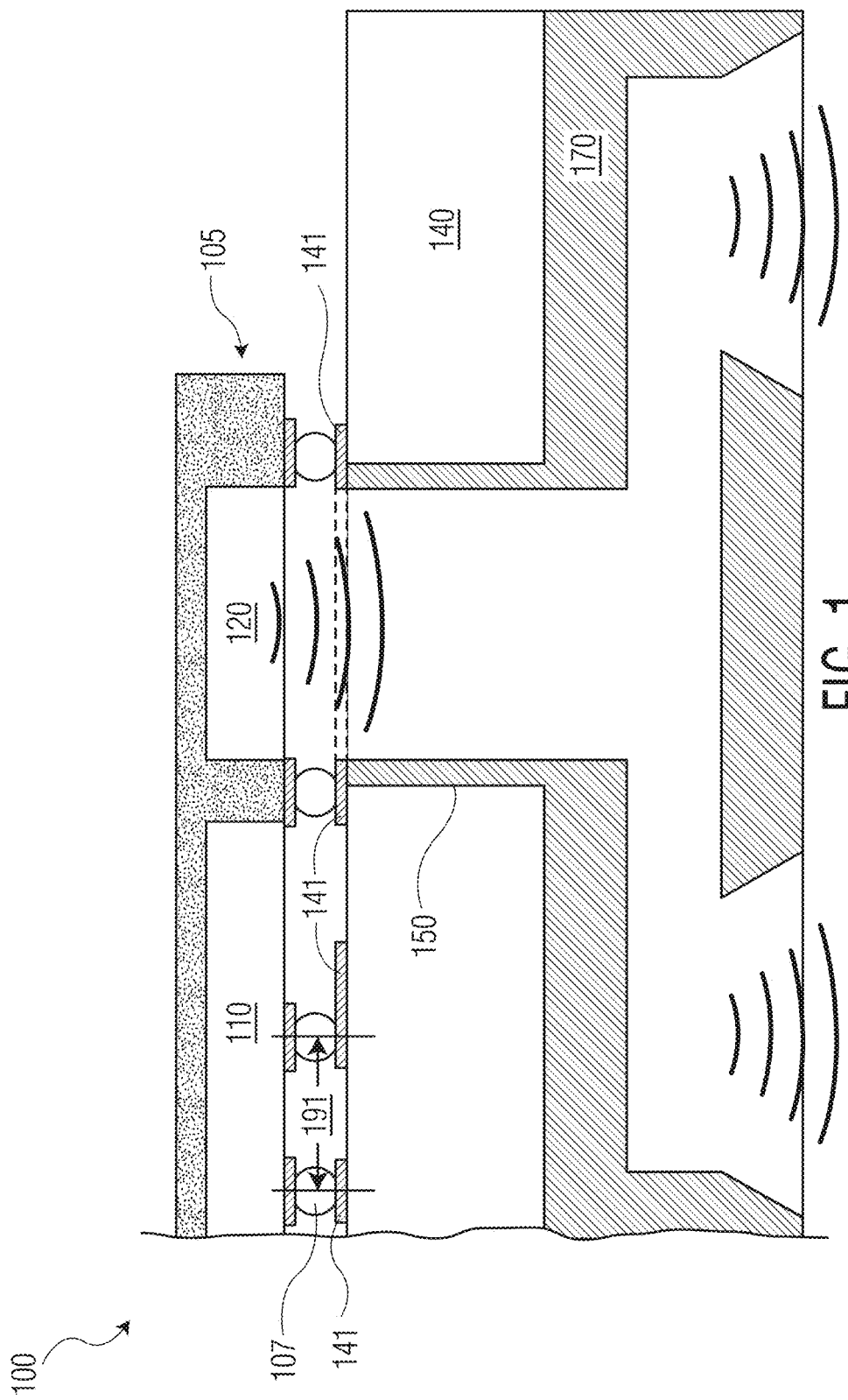
FIG. 1 is a cross-sectional illustration of an electronic device package that includes a millimeter-wave transmitter and a launcher that is coupled to a printed circuit board having an integrated wave guide.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are nonlimiting examples of suitable processes according to embodiments and are for the purposes of illustration. Systems and devices according to embodiments herein may be use any suitable processes including those that omit steps described above, perform those steps and similar steps in different orders, and the like. It will also be appreciated that well-known features may be omitted for clarity.

Unless explicitly stated otherwise, the use of terms "approximately," "substantially" and similar terms in connection with dimensions, relative positioning, or orientation of various features indicates that the dimensions, positioning, or orientation of those features are subject to tolerances and/or expected process variations of equipment and processes chosen to form the described features. Unless explicitly stated otherwise, the use of terms "approximately," "substantially" and similar terms in connection measurable values or characteristics is subject to the expected measurement accuracy of equipment and methods used to measure those values or characteristics and/or within tolerance limits specified by technical standards applicable to the technologies described.

Miniaturization of radiofrequency and microwave electronics for generating and receiving wireless signals present challenges because of the need for structures such as antennae to couple signals from packaged components (e.g., individual chips, systems on a chip, multichip packages, and the like) to free space. While it can be desirable to integrate such structures directly into a chip package, doing so tends to significantly increase the package size because the minimum dimensions of an antenna are often comparable or significantly larger than the effective wavelength of the signals being transmitted. This can increase production costs and introduce undesirable geometric constraints on component placement within larger systems and devices. Some of these constraints are mitigated at higher frequencies such as the 30-300 GHz range ("millimeter waves", having free-space wavelengths between 1-10 mm) because the of the reduced size requirements of components such as antennae and waveguides in the millimeter-wave regime compared to lower frequency regimes (i.e., in the MHz range and lower). However, integration of millimeter-wave launchers and other structures can still significantly limit minimum package sizes relative to the size of individual integrated circuits, as illustrated by FIG. 1.

FIG. 1 is a cross-sectional view of an example system in one approach. The system 100 includes an integrated circuit package (the IC package 105) that contains a millimeter-wave integrated circuit (the IC 110) which is coupled to a millimeter-wave waveguide transition (a launcher 120) that allows millimeter-wave signals generated by the IC 110 to be coupled to an external antenna structure 170. The IC package 105 may be a ball-grid array (BGA) type package and is shown with solder bumps 107 bonding the IC package 105 to contacts 141 on a substrate 140 (which may be a modified printed circuit board, for example). The substrate 140 includes a waveguide section 150 that is coupled to the antenna section 170, thereby allowing millimeter wave signals generated by the IC 110 to be converted into wireless signals that propagate from the launcher 120 into the waveguide section 150 and finally into the antenna 170 which can radiate the signals into the surrounding environment. As shown, the walls of the waveguide section 150 are conductive (e.g., metallized) such that the waveguide section operates as a rectangular waveguide defined by electrically conductive walls with a center that can be filled with a dielectric material such as dielectric material of the substrate 140. Alternatively, the waveguide section 150 and similar structures described herein may be a air-filled, gas-filled, or evacuated cavities within a substrate such as the substrate 140.

It will be appreciated that integrating the launcher 120 into the IC package 105 means that the IC package 105 must be larger than both the launcher 120 and the IC 110 individually. Furthermore, integration of the launcher 120 into the IC package 105 introduces constraints on the placement of solder bumps (e.g., the solder bumps 107) or other structures used to couple the IC package 105 to the substrate 140 via the contacts 141. This is because the path between the launcher 120 and the waveguide section 150 cannot be obstructed by conductive material. Placement of the IC package 105 on the substrate 140 is also constrained because the launcher 120 must be positioned directly over the waveguide section 150 to allow radiated energy to be effectively coupled from the launcher 120 into the waveguide section 150). The solder bumps 107 (or other electrical interconnections between the IC package 105 and the substrate 140) may be arranged in order to maintain compatibility with conventional circuit board designs. For example, the solder bumps 107 (or other interconnections) may be spaced with a minimum spacing indicated by the dimension 191 and/or spaced with a regular pitch defined by the dimension 191.

Figure 2:
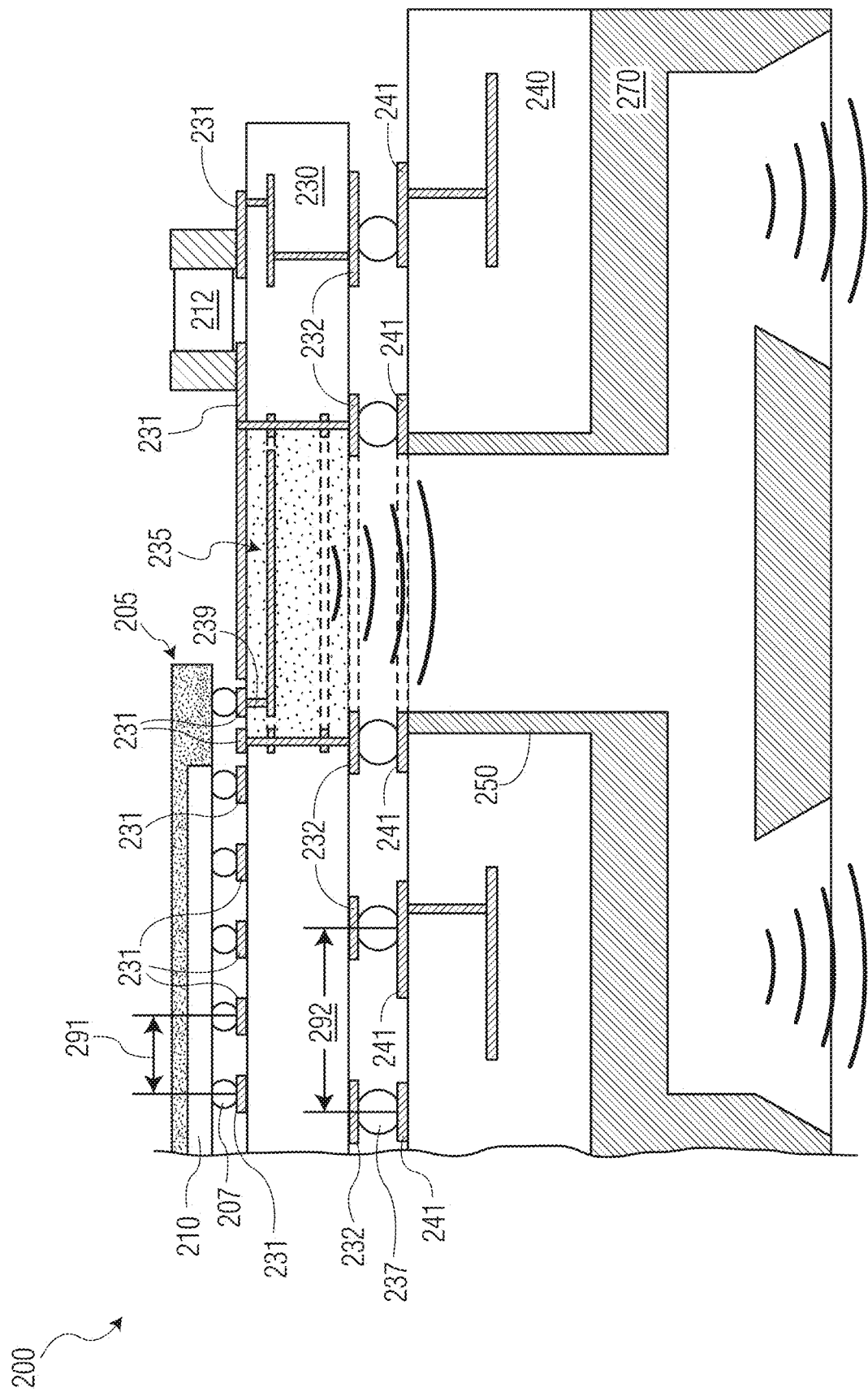
FIG. 2 is a cross-sectional illustration of an electronic device package and system according to one or more embodiments that includes a packaged mm-Wave device coupled to a printed circuit board interposer with an integrated millimeter wave launcher.

Accordingly, embodiments herein allow for reduced package sizes for ICs, such as the IC 110, and related components while facilitating integration with external antenna structures such as the antenna section 170 and the like. FIG. 2 shows an example system according to one or more embodiments herein.

The system 200 includes a package 205 and a substrate 240 (e.g., the substrate 140 of FIG. 1) with a waveguide section 250 (e.g., the waveguide section 150 of FIG. 1) coupled to an antenna section 270 (e.g., the antenna section 170 of FIG. 1). The IC package 205 includes a millimeter-wave integrated circuit (an IC 210; e.g., the IC 110 of FIG. 1) and is shown with solder bumps 207 bonding the IC package 205 to an interposer 230 which may be a printed circuit board (PCB) substrate or any other suitable substrate having the features described further below.

The interposer 230 has a first set of contacts 231 on its top side allowing components such as the IC 210 in the IC package 205 and other components such as the component 212 (represented as a discrete passive device such as an inductor or resistor, as a nonlimiting example) to be physically coupled to the interposer 230. As shown, the IC package 205 is coupled to the contacts 231 on the top surface of the interposer by solder bumps 207, and the component 212 is depicted as being surface-mounted to contacts 231 on the top surface of the interposer via solder reflow, or any other acceptable method, as nonlimiting examples. Components such as the IC package 205 and the component 212 may be electrically coupled as needed to contacts (e.g., contacts 241) on the substrate 240 via a second set of contacts 232 on the bottom of the interposer 230 that are in turn coupled to the substrate 240 (e.g., via solder bumps 237, as shown or by any other suitable method). The contacts 231 on the top side of the interposer 230 can be connected as needed to the contacts 232 on the bottom side in order to enable electrical connections between components such as the IC package 210 and the component 212 on the top surface of the interposer 230.

The interposer 230 includes a transition structure (a launcher 235) which can function similarly to the launcher 120 of FIG. 1, with one difference being that the launcher 235 is disposed within the interposer 230 rather than within the IC package 205. As shown, millimeter-wave signals can be coupled from the IC 210 to the launcher 235 via a feed contact 239 coupled to one of the solder ball connections 207. It will be understood that the IC 210 within the IC package 205 is shown directly connected to the feed contact 239 via a solder bump connection (one of the solder bumps 207) for purposes of illustration, but that any suitable connection method may be used. For example, the IC package 205 may be positioned away from the launcher 235 and coupled to the feed contact 239 via a conductive trace on or within the interposer 230. It will be further understood that nothing herein is intended to require the use solder bump connections. Rather, any suitable structures and methods can be used including solder reflow, conductive adhesives, and the like as nonlimiting examples.

It will be understood that the configuration of components in systems and devices such as the system 200 including an interposer such as the interposer 230 can confer various advantages. As one example, interposers according to one or more embodiments can have arrangements of contacts that are not typically supported by conventional chip assembly processes, while retaining compatibility with conventional circuit board layouts via compatible contacts on the bottom of the interposer (e.g., the solder bumps 237 of FIG. 2). For example, the solder bumps 207 may have a spacing defined by the dimension 291 which may be smaller than supported by conventional printed circuit board assembly processes. Meanwhile, the solder bumps 237 on the opposite side of the interposer 230 may have a spacing defined by the dimension 292 that may maintain compatibility with conventional assembly processes. As a result, chip packages such as the IC package 205 can be made more compact while still being compatible with conventional printed circuit board layouts and/or conventional design rules when the interposer 230 is bonded to a circuit board or other substrate such as the substrate 240 as pictured. Similarly, the solder bumps 207 or other contacts on interposers such as the interposer 230 may be smaller than conventional solder bumps or other contacts while the solder bump 237 or other contacts on such interposers may be conventionally-sized.

Another potential advantage of the use of interposers such as the interposer 230 is the ability to place such packages containing millimeter-wave components such as the—IC 210 remotely, away from structures such as the launcher 235 or the waveguide section 250, allowing for greater flexibility in the design of larger systems built on printed circuit boards or similar substrates such as the substrate 240.

Figure 3:
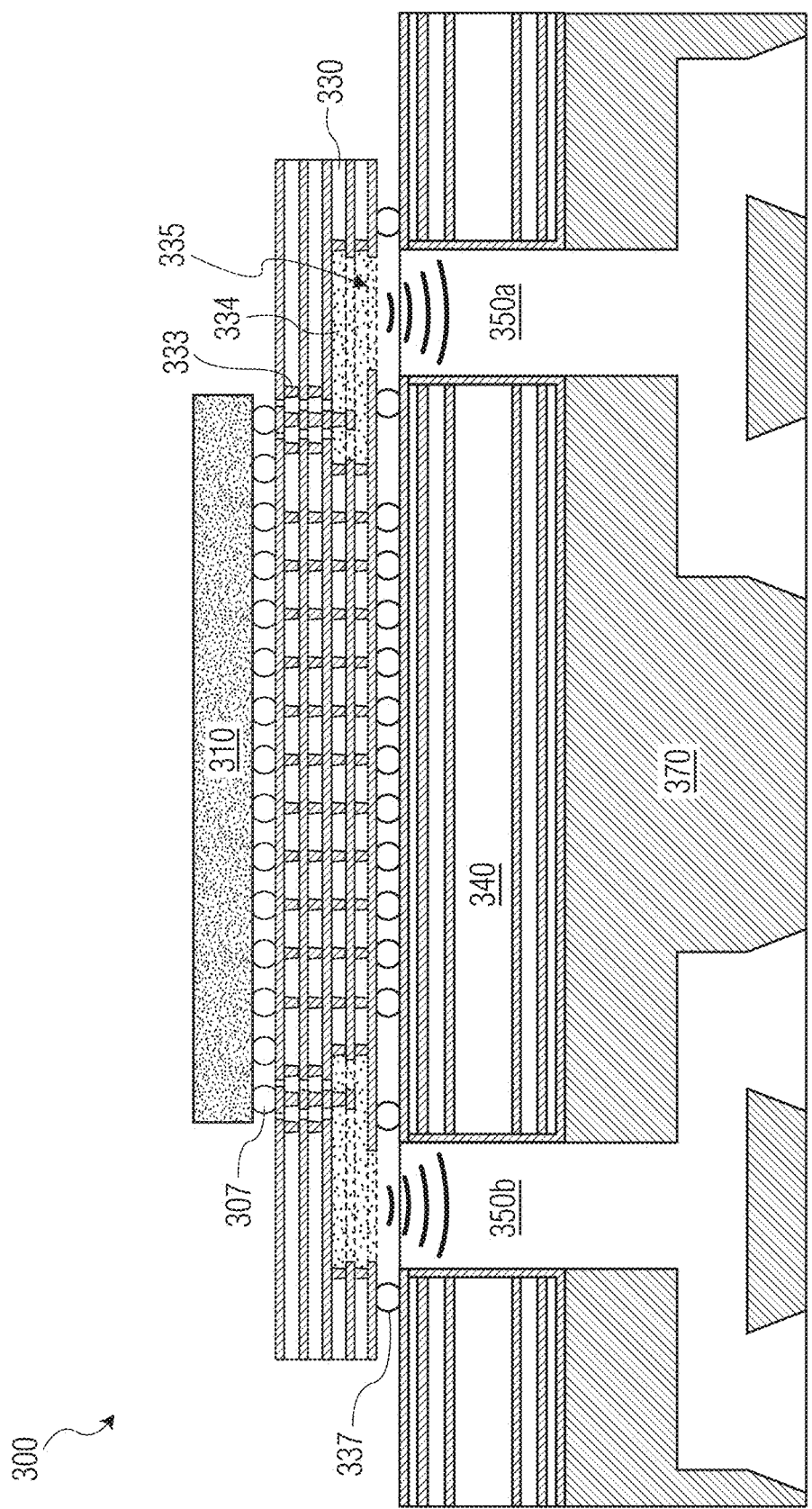
FIG. 3 is a cross-sectional illustration of an electronic device package and system according to one or more embodiments that includes a packaged millimeter-wave device coupled to a printed circuit board interposer that couples millimeter-wave signals from the device to a waveguide via an integrated transition from a ball grid array contact to a horizontal waveguide in the interposer via coaxial transition structure.

FIG. 3 shows a cross-sectional view of another example system featuring another interposer according to one or more embodiments. The system 300 includes a millimeter-wave IC 310 (which may be part of an IC package such as the IC package 205 of FIG. 2), configured to be coupled to an interposer 330, which is in turn configured to be coupled to a substrate 340 (e.g., a substrate 140 of FIG. 1 or a substrate 240 of FIG. 2) that includes an antenna structure 370, which includes two antenna arms fed by the waveguide sections 350a, 350b. The system 300 includes solder balls 307 and 337.

The interposer 330 also includes additional structures that allow for greater flexibility in delivering millimeter wave signals from integrated circuits such as the IC 310 which are discussed further below in connection with FIG. 3 and in further detail with connection to FIG. 4A and FIG. 4B. Specifically, the interposer 330 includes a coaxial transmission structure (a coaxial transition 333) and a waveguide structure (a waveguide transition 334). The coaxial transition 333 is configured to receive millimeter wave signals from the IC 310 and propagate them in a coaxial mode along a conductive feature that functions as a center conductor that is surrounded by electrically conductive material. The coaxial transition 333 is in turn coupled to a waveguide structure (the waveguide transition 334) within the interposer 330. The waveguide transition 334 includes an aperture 335 which can be aligned as shown to propagate millimeter-wave energy received from the IC 310 via the coaxial transition 333 to another waveguide, such as the waveguide section 350a within the substrate 340 in the example of FIG. 3.

FIG. 3 shows a single interposer 330 with a single IC 310 and a substrate 340 with two waveguide sections 350a, 350b for purposes of illustration. It will be understood that nothing herein is intended to limit embodiments only a single integrated circuit on an interposer, to only one interposer on a substrate, or to any specific number of transition structures (e.g., the transitions 333, 334) or to any number of waveguide sections. For example, multiple interposers may be coupled to a substrate and each interposer may include one or more components on its surface. A component such as an IC 210, 310 of FIGS. 2, 3, respectively, may be coupled to one or more antennae, waveguides, or other structures and multiple components such as an IC 210, 310 of FIGS. 2, 3, respectively, may be connected independently or interconnected in any suitable configuration.

Figure 4A:
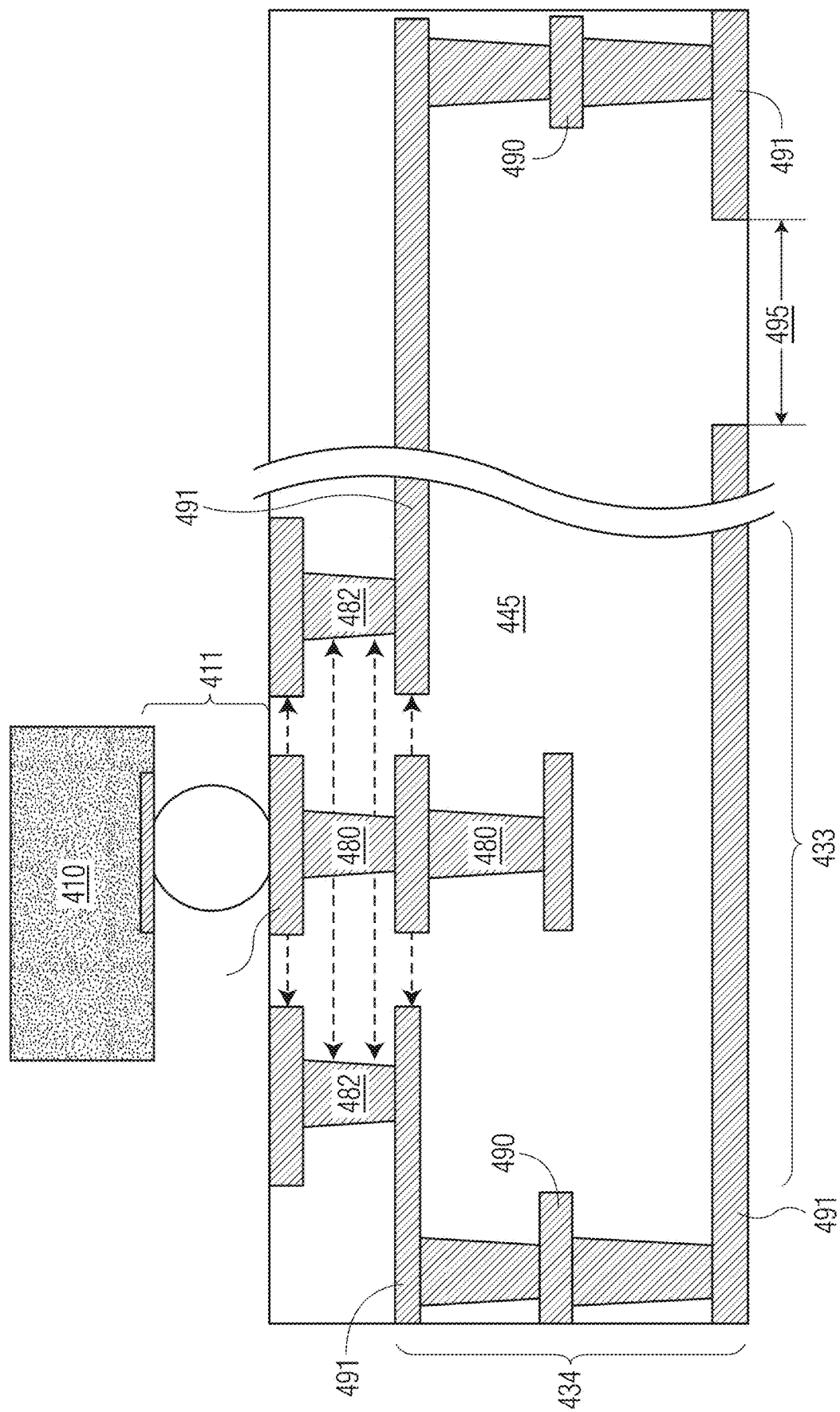
FIG. 4A is a cross-sectional illustration showing elements of a ball-grid-array to horizontal waveguide transition that includes a coaxial transition element according to one or more embodiments.

FIG. 4A is a cross-section view of a junction between a coaxial transition 433 (e.g., the coaxial transition 333 of FIG. 3) and a waveguide transition 434 (e.g., the waveguide transition 334 of FIG. 3) in further detail. As shown, the coaxial transition 433 is formed by a set of vias extending to first depth within in a dielectric material 445 (e.g., printed circuit board material or any other suitable dielectric material) that surround a via 480 that extends to a second depth in the dielectric material 445. As shown, the via 480 penetrates (e.g., extends into) a waveguide transition 434 that extends from the first depth in the dielectric material 445 to a third depth at a first end of the waveguide transition 434. The waveguide transition 434 is a waveguide formed by vertically-oriented conductive sidewalls 490 and horizontally-oriented conductive sidewalls 491 that define a volume in which wireless signals coupled to the waveguide propagate. The waveguide may be a dielectric-filled waveguide, as shown, or a hollow waveguide that is evacuated or gas-filled.

An aperture 495 at a second end of the waveguide transition 433 allows for millimeter-wave energy radiated from the coaxial transition 433 into the waveguide transition 434 to propagate through the aperture 495 to another waveguide structure (e.g., a waveguide section 350a/350b as shown in FIG. 3). A millimeter-wave integrated circuit such as the IC 410 may couple millimeter-wave signals to the coaxial transition 433 via a feed contact structure 411 that electrically couples an internal signal line to the via 480 of the coaxial transition 433. The feed contact structure may include a solder bump (e.g., one of the solder bumps 307 of FIG. 3) as shown or any other suitable conductive connection.

It will be appreciated that, in one or more embodiments, various conductive elements forming a coaxial transition such as the coaxial transition 433 and a waveguide transition such as the waveguide transition 434, are formed using conventional techniques for forming pads and vias in multilayer printed circuit boards and similar substrates. It will be further appreciated that, in one or more embodiments, conductive walls such as the conductive walls 490, 491 need not be continuous for the transitions to function as described; rather, an array of electrically isolated vias or similar structures may behave as a conductive wall when the spacing between such structures approaches the wavelength of the radiated energy being propagated and the individual structures are electrically coupled to each (e.g., by a conductive pad on a surface of the interposer as illustrated in FIG. 4B). For instance, if the wavelength of the radiating energy when propagating in a dielectric material such as the dielectric material 445 is 10 mm, then isolated vias spaced apart from each other with spacings on the order of 1 mm may function equivalently to a solid conductive surface at the corresponding signal frequency and when the vias are electrically short-circuited to each other (e.g., at the top surface of the interposer or a any other convenient locations). As an example, to one approximation, spacings of approximately one-eighth the wavelength are sufficient for electrically coupled elements to behave similarly to a single solid conductor.

Figure 4B:
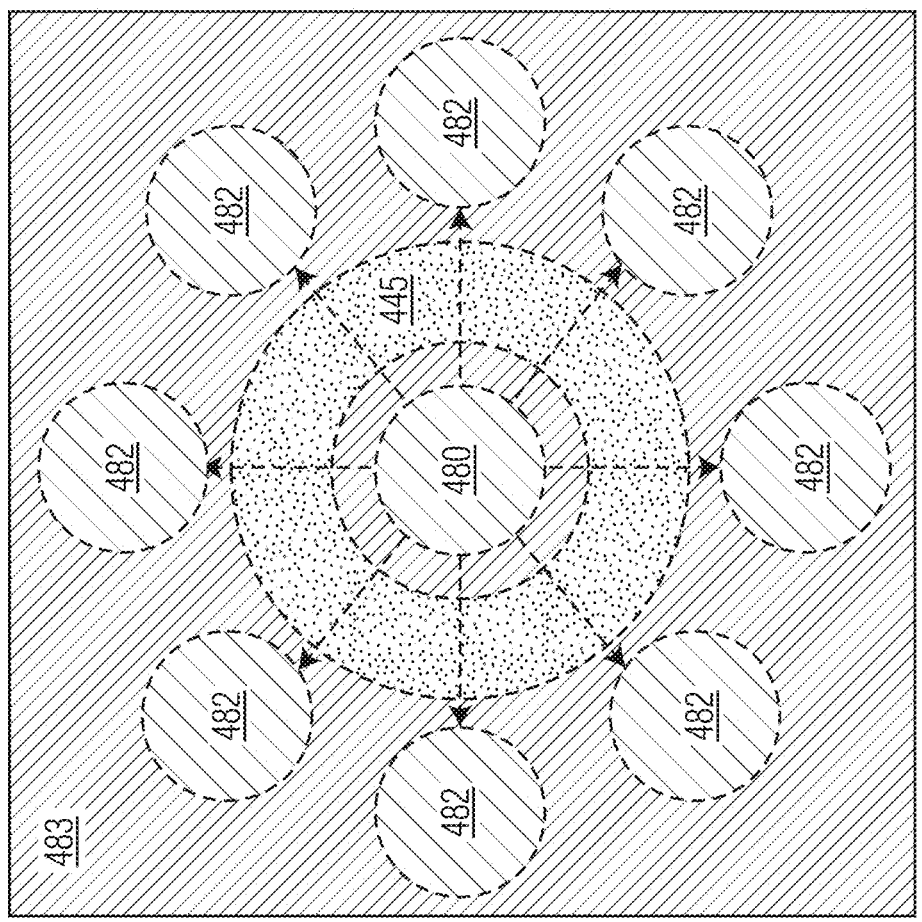
FIG. 4B is a top plan view of the circuit board of FIG. 4A.

Along these lines, FIG. 4B shows a top plan view of the coaxial transition 433 of FIG. 4A in which the central via 480 acts as a center conductor and is surrounded by vias 482 (also shown in FIG. 4A). As shown the vias 482 may be short-circuited to a conductive pad 483 on the surface of a dielectric material such as the dielectric material 445 (e.g., on the top surface of the top surface of the interposer).

It will be appreciated that, although single-ended transmission configuration may be described in connection with examples herein, nothing is intended to limit embodiments to such a single-ended signal transmission configuration. Rather, it will be understood that in one or more embodiments, additional contacts are present enabling a differential signal transmission configuration.

Figure 5B:
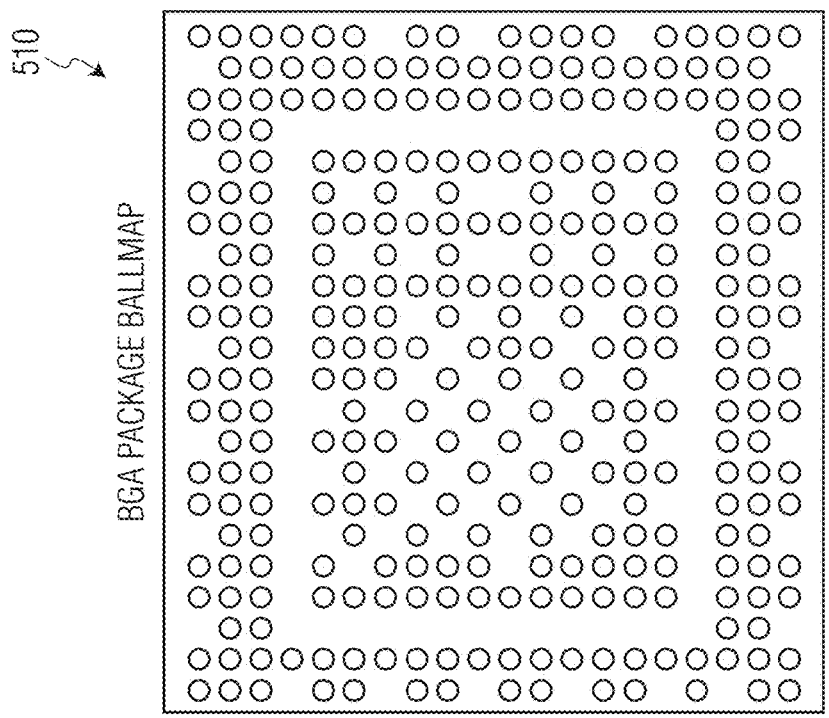
FIG. 5B is a top plan view of an interposer corresponding to the BGA pattern of FIG. 5A according to one or more embodiments.
Figure 5A:
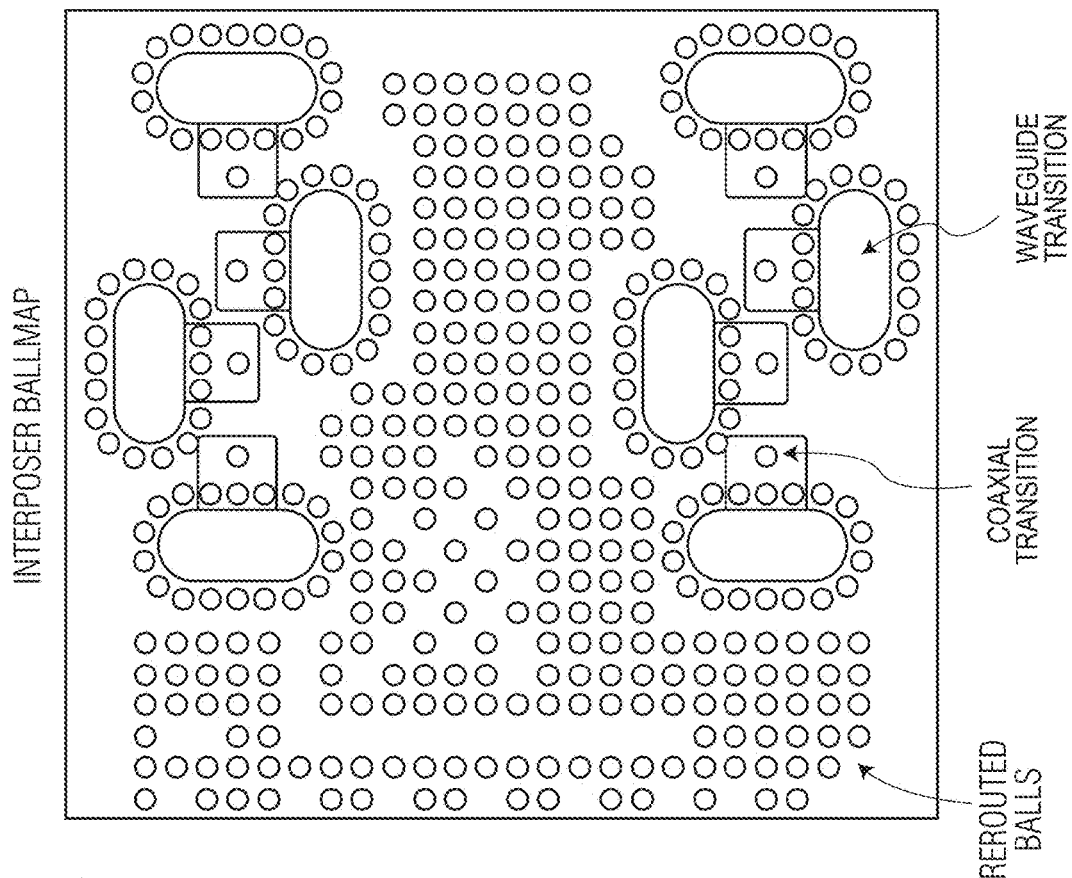
FIG. 5A is a bottom plan view of an example device package according to one or more embodiments showing a pattern of ball grid array (BGA) contacts.

FIG. 5A is a plan view of an interposer 530 such as the interposer 330 according to one or more embodiments. The illustrated plan view may represent an interposer ballmap, including rerouted balls, a coaxial transition, and a waveguide transition. As shown in FIG. 5A interposers according to embodiments herein may have top surfaces with contact areas that deviate from a conventional rectangular array in order to accommodate additional features such as coaxial transitions, integrated waveguide structures, and the like while maintaining a regular arrangement of contact pads on their bottom surfaces in order to be easily coupled to a circuit board of other substrate with a conventional arrangement of contact pads.

Accordingly, as shown in the plan view of FIG. 5B, a millimeter-wave integrated circuit in an IC package 510 such as the IC package 305 may be encapsulated in a chip package with a modified pattern of solder balls or other suitable interconnections to mate to an interposer with a modified contact arrangement such as the one shown in FIG. 5A. The illustrated plan view may represent a BGA package ballmap.

It will be appreciated that ICs and IC packages coupled to interposers according to embodiments herein (e.g., the IC package 205 of FIG. 2 on the interposer 230 of FIG. 2 or the IC 310 of FIG. 3 on the interposer 330 of FIG. 3) can be over molded or otherwise encapsulated to produce a package with an integrated launcher (e.g., as an alternative to the package 105 of FIG. 1). It will be further appreciated that such packages or ICs can be molded or encapsulated in-place after being coupled to another circuit board or other substrate. Such encapsulated structures may also be shielded by enclosing or otherwise surrounded them in suitably conductive material. Thus, in one or more embodiments, an IC coupled to an interposer is encapsulated in polymeric material. In one or more embodiments, such an IC is surrounded by a conductive structure that shields the IC from receiving or generating wireless signal interference.

VARIOUS EXAMPLES

Features of embodiments may be understood by way of one or more of the following examples:

Example 1: a system, device, or method that includes an interposer circuit board ("interposer") having a top surface and a bottom surface; a first set of electrical contacts disposed on the top surface of the interposer; a second set of electrical contacts disposed on the bottom surface of the interposer; a coaxial transition structure; and a waveguide structure.

The coaxial transition structure is formed by a first via and a set of additional vias. The first via that extends along a vertical direction from a feed contact belonging to the first set of electrical contacts to a first depth within the substrate; and the set of additional vias surround the first via and extend along the vertical direction from the top surface of the substrate to second depth within the substrate that is less than first depth. Each of the vias of the set of additional vias are electrically short-circuited to each other and are separated from the first via by dielectric material of the interposer.

The waveguide structure is formed within the interposer beneath the set of additional vias that defines a volume in which wireless signals coupled to the waveguide propagate; and the waveguide structure extends in a horizontal direction from a first waveguide end to a second waveguide end. The waveguide structure extends along a vertical direction from the second depth within the interposer to a third depth within the interposer that is greater than the second depth. The waveguide structure has an aperture at the third depth within the interposer at the second waveguide end where conductive material defining the waveguide is absent.

The first via penetrates the waveguide structure at the first waveguide end and extends within the waveguide structure from the first depth to the second depth. The coaxial transition structure and the waveguide structure are jointly configured and arranged to direct millimeter-wave energy delivered to the feed contact to the aperture in the waveguide structure.

Example 2: the system, device or method of Example 1, where vias of the set of additional vias are separated from each other within the interposer by the dielectric material of the interposer.

Example 3: the system, device, or method of Example 2 in which the vias of the set of additional vias are physically separated from each other within the interposer by a spacing that is less than a distance equal to a characteristic wavelength of propagating electromagnetic radiation within the interposer that corresponds to a desired operating frequency of the device. The vias of the set of additional vias are also electrically short-circuited to each other.

Example 4: the system, device, or method of any of Examples 1-3, where contacts of the first set of contacts are spaced apart from each other with a spacing characterized by a first contact pitch and contacts of the second set of contacts are spaced apart from each other with a spacing characterized by a second contact pitch that is different from the first contact pitch.

Example 5: the system, device, or method of Example 4 in which the first contact pitch is smaller than the second contact pitch.

Example 6: the system, device, or method of any of Examples 4 or Example 5, in which the contacts of the first set of contacts have a smaller diameter than the contacts of the second set of contacts.

Example 7: the system, device, or method of any of Examples 1-6, further including an integrated circuit (IC) bonded to the top surface of the interposer and electrically coupled to electrical contacts belonging to the first set of electrical contacts. This Example also includes an additional circuit board having a top surface bonded to the bottom surface of the interpose.

The IC is configured to transmit or receive millimeter-wave signals via the feed contact. The IC, the interposer, and the additional circuit board are jointly configured and arranged such that wireless millimeter wave signals are coupled between the IC and the additional circuit board via the aperture in the waveguide structure of the interposer.

Example 8: the system, device, or method of any of Examples 1-7, further including an additional circuit board that includes an antenna structure. The IC, the interposer, and the additional circuit board are jointly configured and arranged such that wireless millimeter wave signals are coupled between the IC and antenna structure of the additional circuit board via the aperture in the waveguide structure of the interposer.

Example 9: the system, device, or method of any of Examples 1-8 in which the additional circuit board includes an additional waveguide structure. The aperture of the waveguide structure of the interposer is aligned to couple wireless signals between the waveguide structure and the additional waveguide structure.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no Intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A device comprising:
   an interposer circuit board ("interposer") having a top surface and a bottom surface;
   a first set of electrical contacts disposed on the top surface of the interposer;
   a second set of electrical contacts disposed on the bottom surface of the interposer;
   a coaxial transition structure formed by:
     a first via that extends along a vertical direction from a feed contact belonging to the first set of electrical contacts to a first depth within the interposer; and
     a set of additional vias that surround the first via and extend along the vertical direction from the top surface of the interposer to a second depth within the substrate interposer that is less than first depth;
     wherein each of the set of additional vias are electrically short-circuited to each other and are separated from the first via by dielectric material of the interposer; and
   a waveguide structure formed within the interposer beneath the set of additional vias that defines a volume in which wireless signals coupled to the waveguide structure propagate;
   wherein the waveguide structure extends in a horizontal direction from a first waveguide end to a second waveguide end;
   wherein the waveguide structure extends along a vertical direction from the second depth within the interposer to a third depth within the interposer that is greater than the second depth;
   wherein the first via penetrates the waveguide structure at the first waveguide end and extends within the waveguide structure from the first depth to the second depth;
   wherein the waveguide structure has an aperture at the third depth within the interposer at the second waveguide end where conductive material defining the waveguide is absent; and
   wherein the coaxial transition structure and the waveguide structure are jointly configured and arranged to direct millimeter-wave energy delivered to the feed contact to the aperture in the waveguide structure.

2. The device of claim 1, wherein vias of the set of additional vias are separated from each other within the interposer by the dielectric material of the interposer.

3. The device of claim 2, wherein the vias of the set of additional vias are physically separated from each other within the interposer by a spacing that is less than a distance equal to a characteristic wavelength of propagating electromagnetic radiation within the interposer that corresponds to a desired operating frequency of the device.

4. The device of claim 1, wherein contacts of the first set of contacts are spaced apart from each other with a spacing characterized by a first contact pitch and contacts of the second set of contacts are spaced apart from each other with a spacing characterized by a second contact pitch that is different from the first contact pitch.

5. The device of claim 4, wherein the first contact pitch is smaller than the second contact pitch.

6. The device of claim 4, wherein the contacts of the first set of contacts have a smaller diameter than the contacts of the second set of contacts.

7. A system comprising:
an interposer circuit board ("interposer") having a top surface and a bottom surface, the interposer comprising:
a first set of electrical contacts disposed on the top surface of the interposer;
a second set of electrical contacts disposed on the bottom surface of the interposer;
a coaxial transition structure formed by:
a first via that extends along a vertical direction from a feed contact belonging to the first set of electrical contacts to a first depth within the interposer; and
a set of additional vias that surround the first via and extend along the vertical direction from the top surface of the interposer to second depth within the interposer that is less than first depth;
wherein each of the set of additional vias are electrically short-circuited to each other and are separated from the first via by dielectric material of the interposer; and
a waveguide structure formed within the interposer beneath the set of additional vias that defines a volume in which wireless signals coupled to the waveguide structure propagate;
wherein the waveguide structure extends in a horizontal direction from a first waveguide end to a second waveguide end;
wherein the waveguide structure extends along a vertical direction from the second depth within the interposer to a third depth within the interposer that is greater than the second depth;
wherein the first via penetrates the waveguide structure at the first waveguide end and extends within the waveguide structure from the first depth to the second depth;
wherein the waveguide structure has an aperture at the third depth within the interposer at the second waveguide end where conductive material defining the waveguide is absent; and
wherein the coaxial transition structure and the waveguide structure are jointly configured and arranged to direct millimeter-wave energy delivered to the feed contact to the aperture in the waveguide structure;
an integrated circuit (IC) bonded to the top surface of the interposer and electrically coupled to electrical contacts belonging to the first set of electrical contacts, wherein the IC is configured to transmit or receive millimeter-wave signals via the feed contact; and
an additional circuit board having a top surface bonded to the bottom surface of the interposer;
wherein the IC, the interposer, and the additional circuit board are jointly configured and arranged such that wireless millimeter wave signals are coupled between the IC and the additional circuit board via the aperture in the waveguide structure of the interposer.

8. The system of claim 7, wherein vias of the set of additional vias are separated from each other within the interposer by the dielectric material of the interposer.

9. The system of claim 8, wherein the vias of the set of additional vias are physically separated from each other within the interposer by a spacing that is less than a distance equal to a characteristic wavelength of propagating electromagnetic radiation within the interposer that corresponds to a desired operating frequency of the device.

10. The system of claim 7, wherein contacts of the first set of contacts are spaced apart from each other with a spacing characterized by a first contact pitch and contacts of the second set of contacts are spaced apart from each other with a spacing characterized by a second contact pitch that is different from the first contact pitch.

11. The system of claim 10, wherein the first contact pitch is smaller than the second contact pitch.

12. The device of claim 10, wherein the contacts of the first set of contacts have a smaller diameter than the contacts of the second set of contacts.

13. The system of claim 7,
wherein the additional circuit board comprises an antenna structure; and
wherein the IC, the interposer, and the additional circuit board are jointly configured and arranged such that wireless millimeter wave signals are coupled between the IC and antenna structure of the additional circuit board via the aperture in the waveguide structure of the interposer.

14. The system of claim 7, wherein the additional circuit board comprises an additional waveguide structure; and wherein the aperture of the waveguide structure of the interposer is aligned to couple wireless signals between the waveguide structure and the additional waveguide structure.

15. A method comprising:
bonding an interposer circuit board ("interposer") having a top surface and a bottom surface to an additional circuit board having an antenna structure;
wherein the interposer comprises:
a first set of electrical contacts disposed on the top surface of the interposer;
a second set of electrical contacts disposed on the bottom surface of the interposer;
a coaxial transition structure formed by:
a first via that extends along a vertical direction from a feed contact belonging to the first set of electrical contacts to a first depth within the interposer; and
a set of additional vias that surround the first via and extend along the vertical direction from the top surface of the interposer to second depth within the interposer that is less than first depth;
wherein each of the set of additional vias are electrically short-circuited to each other and are separated from the first via by dielectric material of the interposer; and
a waveguide structure formed within the interposer beneath the set of additional vias that defines a volume in which wireless signals coupled to the waveguide structure propagate;
wherein the waveguide structure extends in a horizontal direction from a first waveguide end to a second waveguide end;
wherein the waveguide structure extends along a vertical direction from the second depth within the interposer to a third depth within the interposer that is greater than the second depth;
wherein the first via penetrates the waveguide structure at the first waveguide end and extends within the waveguide structure from the first depth to the second depth;

wherein the waveguide structure has an aperture at the third depth within the interposer at the second waveguide end where conductive material defining the waveguide is absent; and wherein the coaxial transition structure and the waveguide structure are jointly configured and arranged to direct millimeter-wave energy delivered to the feed contact to the aperture in the waveguide structure;

wherein the additional circuit board comprises a top surface configured to be bonded to the bottom surface of the interposer;

wherein the interposer, and the additional circuit board are jointly configured and arranged such that wireless millimeter wave signals are coupled between the feed contact and the additional circuit board via the aperture in the waveguide structure of the interposer.

16. The method of claim 15, wherein the vias of the set of additional vias are separated from each other within the interposer by the dielectric material of the interposer;

wherein the vias of the set of additional vias are separated from each other within the interposer by a spacing that is less than a distance equal to a characteristic wavelength of propagating electromagnetic radiation within the interposer that corresponds to a desired operating frequency of the device.

17. The method of claim 15, wherein contacts of the first set of contacts are spaced apart from each other with a spacing characterized by a first contact pitch and contacts of the second set of contacts are spaced apart from each other with a spacing characterized by a second contact pitch that is different from the first contact pitch; and wherein first contact pitch is smaller than the second contact pitch or the contacts of the first set of contacts have a smaller diameter than the contacts of the second set of contacts.

18. The method of claim 15, wherein the additional circuit board comprises an antenna structure; and wherein the IC, the interposer, and the additional circuit board are jointly configured and arranged such that wireless millimeter wave signals are coupled between the IC and antenna structure of the additional circuit board via the aperture in the waveguide structure of the interposer.

19. The method of claim 15, wherein the additional circuit board comprises an additional waveguide structure; and wherein the method further comprises aligning the aperture of the waveguide structure of the interposer over the additional waveguide structure such that wireless signals can propagate between the waveguide structure of the interposer and the additional waveguide structure.

* * * * *